US011082032B2

United States Patent
Kim et al.

(10) Patent No.: US 11,082,032 B2
(45) Date of Patent: Aug. 3, 2021

(54) SYSTEM FOR GENERATING LOW-JITTER DIGITAL CLOCK SIGNALS USING PULSED LASER

(71) Applicants: KOREA ADVANCED INSTITUTE OF SCIENCE AND TECHNOLOGY, Daejeon (KR); KOREA UNIVERSITY RESEARCH AND BUSINESS FOUNDATION, SEJONG CAMPUS, Sejong-si (KR)

(72) Inventors: Jungwon Kim, Daejeon (KR); Hayun Cecillia Chung, Sejong-si (KR); Minji Hyun, Daejeon (KR); Yongjin Na, Daejeon (KR)

(73) Assignees: Korea Advanced Institute of Science and Technology, Daejeon (KR); Korean University Research and Business Foundation, Sejong Campus, Sejong-si (KR)

(*) Notice: Subject to any disclaimer, the term of this patent is extended or adjusted under 35 U.S.C. 154(b) by 0 days.

(21) Appl. No.: 16/801,432

(22) Filed: Feb. 26, 2020

(65) Prior Publication Data
US 2020/0350898 A1 Nov. 5, 2020

(30) Foreign Application Priority Data
Apr. 30, 2019 (KR) .................. 10-2019-0050488

(51) Int. Cl.
*H03K 3/42* (2006.01)
*G01J 1/04* (2006.01)
(Continued)

(52) U.S. Cl.
CPC .............. *H03K 3/42* (2013.01); *G01J 1/0418* (2013.01); *G01J 1/4228* (2013.01); *G01J 1/46* (2013.01);
(Continued)

(58) Field of Classification Search
CPC .... H03K 3/42; H03K 3/01; H03K 3/00; G01J 1/0418; G01J 1/4228; G01J 1/46;
(Continued)

(56) References Cited

U.S. PATENT DOCUMENTS 5,418,360 A * 5/1995 Sokolowska ........ G02B 6/2861
250/227.12
7,389,197 B2 6/2008 Meschenmoser et al.
(Continued)

FOREIGN PATENT DOCUMENTS

KR 100884418 B1 2/2009

OTHER PUBLICATIONS

C. Debaes, et al., "Receiver-Less Optical Clock Injection for Clock Distribution Networks", IEEE Journal of Selected Topics in Quantum Electronics, vol. 9, pp. 400-409, 2003.

*Primary Examiner* — John R Lee
(74) *Attorney, Agent, or Firm* — Harness, Dickey & Pierce, P.L.C.

(57) ABSTRACT

A low-jitter digital clock signal generating system which uses optical pulses output from a pulse laser includes a first balanced photodetector that converts first and second optical pulses with a delayed time interval into first and second electrical pulses through first and second photodiodes and outputs first and second modulated pulses generated by allowing the first and second electrical pulses to partially overlap each other, a second balanced photodetector that converts third and fourth optical pulses with the delayed time interval into third and fourth electrical pulses through third and fourth photodiodes, and outputs a second modulated pulse generated by allowing the third and fourth electrical pulses to partially overlap each other, and a capacitor. The capacitor is charged by the first modulated pulse, is discharged by the second modulated pulse, and
(Continued)

outputs a voltage according to the charging and discharging as a clock signal.

14 Claims, 8 Drawing Sheets

(51) Int. Cl.
  *G01J 1/42* (2006.01)
  *G01J 1/46* (2006.01)
  *G06F 1/04* (2006.01)
  *G01J 1/44* (2006.01)

(52) U.S. Cl.
  CPC ........ *G06F 1/04* (2013.01); *G01J 2001/4238* (2013.01); *G01J 2001/446* (2013.01)

(58) Field of Classification Search
  CPC ................. G01J 1/44; G01J 2001/4238; G01J 2001/446; G06F 1/105; G06F 1/10; G06F 1/04
  See application file for complete search history.

(56) References Cited

U.S. PATENT DOCUMENTS

| | | | |
|---|---|---|---|
| 7,492,981 | B2 | 2/2009 | Furuyama |
| 7,805,085 | B2 | 9/2010 | Noheji |
| 10,305,456 | B2 * | 5/2019 | Zegmout .................. H03K 3/42 |
| 2006/0251427 | A1 * | 11/2006 | Furuyama ............... G06F 1/105 |
| | | | 398/183 |
| 2009/0310978 | A1 * | 12/2009 | Uemura ............... H04B 10/801 |
| | | | 398/195 |
| 2018/0152180 | A1 * | 5/2018 | Pache ..................... H01L 31/08 |
| 2019/0305854 | A1 * | 10/2019 | Campos ............... H04B 10/614 |
| 2020/0350898 | A1 * | 11/2020 | Kim .......................... G01J 1/46 |
| 2020/0389158 | A1 * | 12/2020 | Kim ........................ G06F 1/105 |

\* cited by examiner

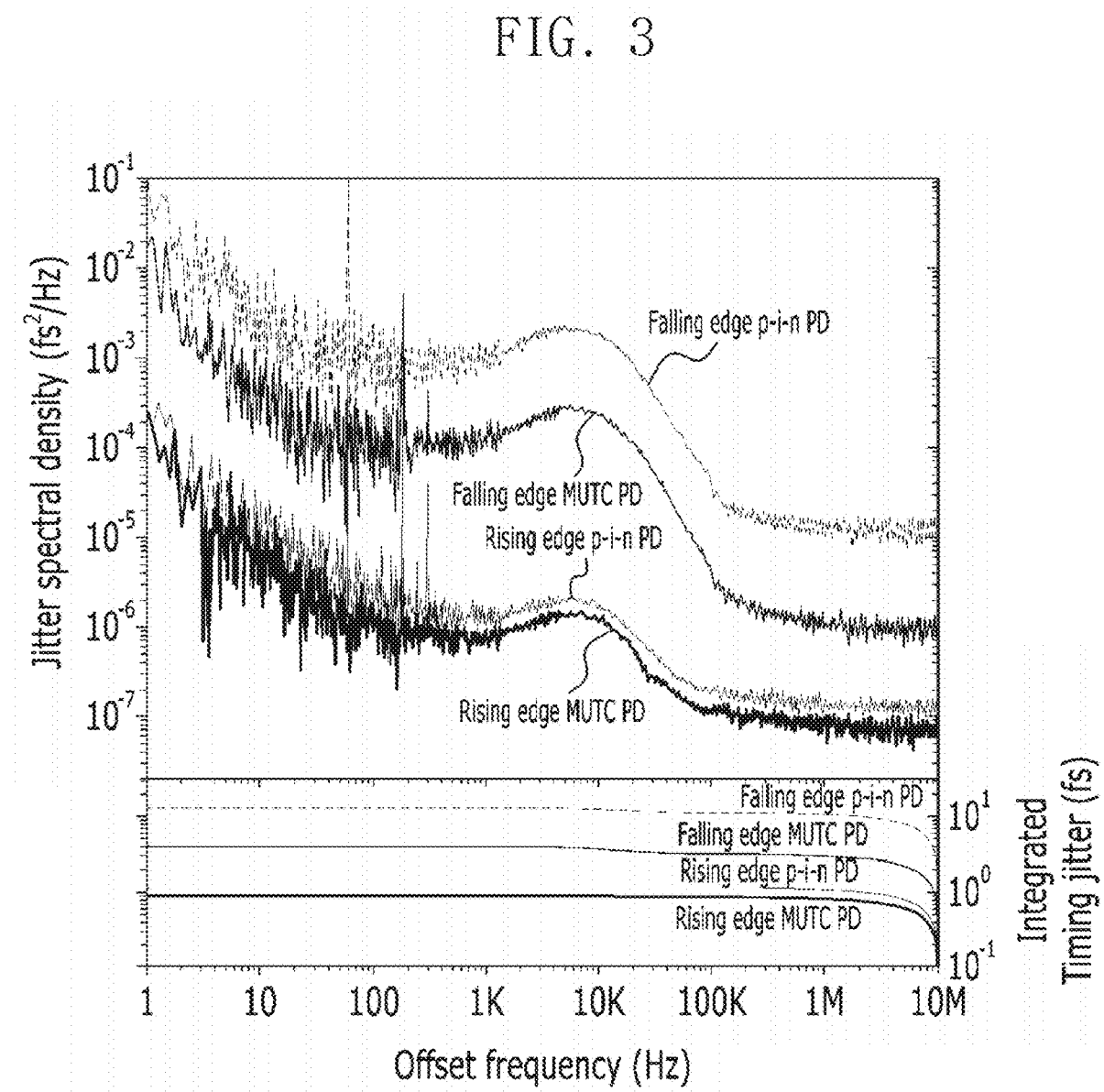

SYSTEM FOR GENERATING LOW-JITTER DIGITAL CLOCK SIGNALS USING PULSED LASER

CROSS-REFERENCE TO RELATED APPLICATIONS

This application claims priority under 35 U.S.C. § 119 to Korean Patent Application No. 10-2019-0050488 filed on Apr. 30, 2019, in the Korean Intellectual Property Office, the disclosures of which are incorporated by reference herein in their entireties.

BACKGROUND

The inventive concept relates to a digital clock. Also, the inventive concept relates to microwave generation.

A digital clock signal may be a square wave "S" in which there appear two logic levels being logical high and logical low periodically, and a digital circuit processes a signal in synchronization with a clock signal.

An existing clock distribution technology uses a scheme to generate and distribute a voltage signal. According to this scheme, a plurality of clock drivers have to be used to overcome a limitation on a bandwidth due to a large capacitance load. This causes a reduction of a timing jitter and skew performance and an increase of power consumption and is problematic in terms of heat management.

SUMMARY

Embodiments of the inventive concept provide a system that generates a current pulse through direct photodetection and generates a digital clock by charging and discharging a capacitor with the current pulse.

In detail, embodiments of the inventive concept provide a digital clock signal generating system that provides a uniform, excellent timing jitter performance in the whole edge period of a digital clock through current pulse modulation.

In addition, embodiments of the inventive concept provide a system that generates a low-jitter microwave signal of a sine wave shape from a current pulse generated through direct photodetection.

According to an embodiment, a low-jitter digital clock signal generating system which uses optical pulses output from a pulse laser includes a first balanced photodetector that receives a first optical pulse and a second optical pulse with a delayed time interval, converts the first optical pulse and the second optical pulse into a first electrical pulse and a second electrical pulse through a first photodiode and a second photodiode, and outputs a first modulated pulse generated by allowing the first electrical pulse and the second electrical pulse to partially overlap each other, a second balanced photodetector that receives a third optical pulse and a fourth optical pulse with the delayed time interval, converts the third optical pulse and the fourth optical pulse into a third electrical pulse and a fourth electrical pulse through a third photodiode and a fourth photodiode, and outputs a second modulated pulse generated by allowing the third electrical pulse and the fourth electrical pulse to partially overlap each other, and a capacitor. The capacitor is charged by the first modulated pulse, is discharged by the second modulated pulse, and outputs a voltage according to the charging and discharging as a clock signal.

The low-jitter digital clock signal generating system may further include a first optical delay line that delays at least one of the first optical pulse and the second optical pulse as much as a specified time, and a second optical delay line that delays at least one of the third optical pulse and the fourth optical pulse as much as the specified time.

The low-jitter digital clock signal generating system may further include a first optical attenuator that attenuates at least one of the first optical pulse and the second optical pulse such that the first optical pulse and the second optical pulse have a specified power ratio, and a second optical attenuator that attenuates at least one of the third optical pulse and the fourth optical pulse such that the third optical pulse and the fourth optical pulse have the specified power ratio.

The specified power ratio may be adjusted based on a waveform of the clock signal generated by the first modulated pulse and the second modulated pulse.

Each of the first balanced photodetector and the second balanced photodetector may be implemented with a p-i-n photodiode or with a uni-travelling carrier (UTC)/modified uni-travelling carrier (MUTC) photodiode.

The first modulated pulse may be generated to have a shape including rising edge characteristics of the first electrical pulse and the second electrical pulse by adjusting powers of the first optical pulse and the second optical pulse and a delay difference of the first optical pulse and the second optical pulse, and the second modulated signal may be generated to correspond to the first modulated pulse.

The first optical pulse may be converted into the first electrical pulse by the first photodiode connected to a high voltage, the second optical pulse delayed with respect to the first optical pulse may be converted into the second electrical pulse by the second photodiode connected to a low voltage, and the shape of the first modulated pulse may vary depending on a power ratio of the first optical pulse and the second optical pulse and the delay difference of the first optical pulse and the second optical pulse.

According to another embodiment, a low-jitter digital clock signal generating system which uses optical pulses output from a pulse laser includes a first balanced photodetector that converts optical pulses having adjusted powers and delay difference into current pulses through photoelectric conversion and outputs a first modulated pulse generated by allowing the current pulses to overlap each other, a second balanced photodetector that has the same structure as the first balanced photodetector, and outputs a second modulated pulse, which has the same magnitude as the first modulated pulse and is in an opposite direction to the first modulated pulse, with the first modulated pulse and the second modulated signal having a given time interval, and a capacitor. The capacitor is charged by the first modulated pulse, is discharged by the second modulated pulse, and outputs a voltage according to the charging and discharging as a clock signal.

The low-jitter digital clock signal generating system may further include an optical attenuator that adjusts the powers of the optical pulses output from the pulse laser, and an optical delay line that adjusts the delay difference such that the current pulses generated based on the optical pulses output from the pulse laser overlap each other. The optical pulses, of which the powers and the delay difference are adjusted through the optical attenuator and the optical delay line, may be input to the first balanced photodetector and the second balanced photodetector.

The optical attenuator and the optical delay line may vary the powers and the delay difference of the optical pulses respectively input to the first balanced photodetector and the second balanced photodetector to vary a waveform of the clock signal.

By adjusting the powers and the delay difference of the optical pulses generating electrical pulses, each of the first modulated pulse and the second modulated pulse is generated to have a shape including rising edge characteristics of the electrical pulses overlapping each other.

Each of the first balanced photodetector and the second balanced photodetector may be implemented with a p-i-n photodiode or with a uni-travelling carrier (UTC)/modified uni-travelling carrier (MUTC) photodiode.

According to another embodiment, a low-jitter digital clock signal generating system which uses optical pulses output from a pulse laser includes a balanced photodetector that receive a first optical pulse and a second optical pulse with a delayed time interval, converts the first optical pulse and the second optical pulse into a first electrical pulse and a second electrical pulse respectively through a first photodiode and a second photodiode, and outputs a modulated pulse generated by allowing the first electrical pulse and the second electrical pulse to partially overlap each other, and a bandpass filter that filters the modulated pulse with a specific frequency to output a microwave. The specific frequency is a frequency corresponding to a multiple of a repetition rate of the pulse laser.

The low-jitter digital clock signal generating system may further include an optical delay line that delays at least one of the first optical pulse and the second optical pulse as much as a specified time, and an optical attenuator that attenuates a power of at least one of the first optical pulse and the second optical pulse.

By adjusting powers and delay times of the first optical pulse and the second optical pulse, the modulated pulse is generated to have a shape including rising edge characteristics of the first electrical pulse and the second electrical pulse.

BRIEF DESCRIPTION OF THE FIGURES

The above and other objects and features of the inventive concept will become apparent by describing in detail exemplary embodiments thereof with reference to the accompanying drawings.

FIG. 3 is a diagram illustrating a jitter for each photodetector type.

DETAILED DESCRIPTION

Figure 1:
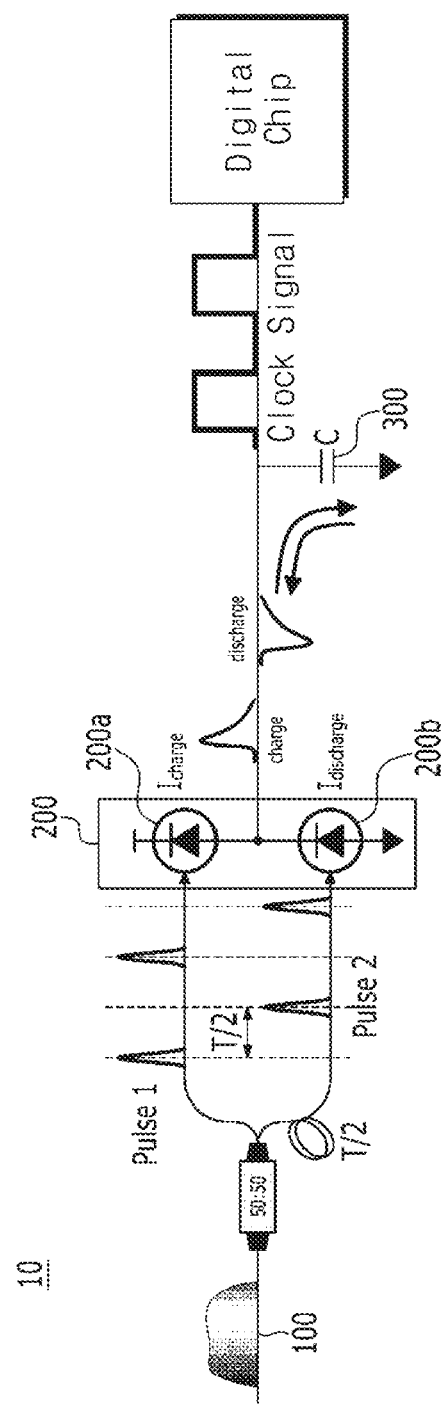
FIG. 1 is a structure diagram of an optical pulse based digital clock signal generating system according to an embodiment.

Various embodiments of the inventive concept will be described more fully with reference to the accompanying drawings to such an extent as to be easily embodied by one skilled in the art. However, the inventive concept may be embodied in many different forms and should not be construed as limited to the embodiments set forth herein. In drawings, components or elements not associated with the detailed description may be omitted to describe the inventive concept clearly, and like reference numerals refer to like elements throughout this application.

It will be understood that the terms "comprises," "comprising," "includes" and/or "including," when used herein, specify the presence of stated elements and/or components, but do not preclude the presence or addition of one or more other elements and/or components.

Figure 2A:
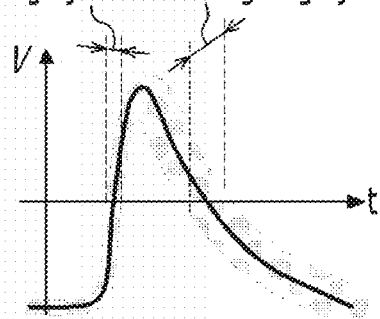
FIGS. 2A and 2B are a diagram describing a digital clock signal generated from a current pulse according to an embodiment.
Figure 2B:
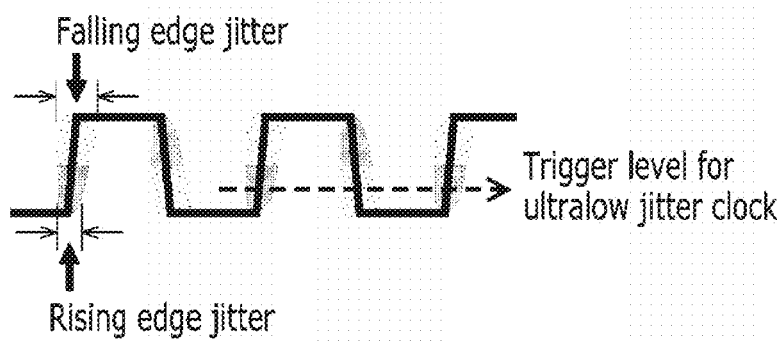

FIG. 1 is a structure diagram of an optical pulse based digital clock signal generating system according to an embodiment, FIG. 2A and FIG. 2B are a diagram for describing a digital clock signal generated from a current pulse according to an embodiment, and FIG. 3 is a diagram illustrating a jitter for each photodetector type.

Referring to FIG. 1, a digital clock signal generating system 10 includes a pulse laser 100, a balanced photodetector 200, and a capacitor 300 that is charged or discharged by a current pulse output from the balanced photodetector 200. The balanced photodetector 200 is implemented with a circuit in which an optical pulse train is input to each of two serially-connected photoelectric elements 200a and 200b and a current pulse generated at the two photoelectric elements 200a and 200b through photoelectric conversion is output. An output port of the balanced photodetector 200 is connected to the capacitor 300. The capacitor 300 is an integrator. Below, a photoelectric element is simply called a "photodiode".

The pulse laser 100 outputs an optical pulse periodically. The pulse laser 100 may be a mode-locked laser (MLL). The pulse laser 100 may be a femtosecond laser that generates a very short optical pulse of a femtosecond scale, but a kind of a laser is not limited thereto. An optical pulse train that is output from the pulse laser 100 may be split by a coupler into a first optical pulse train Pulse 1 and a second optical pulse train Pulse 2 so as to be transferred to a first path and a second path. The first optical pulse train is input to the first photodiode 200a through the first path, and the second optical pulse train is input to the second photodiode 200b through the second path. The coupler may divide an optical pulse in a ratio of 50:50. The first optical pulse train and the second optical pulse train are input to the balanced photodetector 200 with a time difference (or a delay) corresponding to half the period T/2 of a clock, and the capacitor 300 is repeatedly charged and discharged by a current pulse generated by using the first optical pulse train and the second optical pulse train. In FIG. 1, it is assumed that a delay line is implemented on the second path.

The first photodiode 200a measures the first optical pulse train input thereto. That is, the first photodiode 200a performs photoelectric conversion on the first optical pulse train to output a first current pulse train $I_{charge}$. The first current pulse train $I_{charge}$ that is generated by performing photoelectric conversion on the first optical pulse train charges the capacitor 300.

The second photodiode 200b measures the second optical pulse train input thereto. That is, the second photodiode 200b performs photoelectric conversion on the second optical pulse train to output a second current pulse train $I_{discharge}$. The second current pulse train $I_{discharge}$ that is generated by performing photoelectric conversion on the second optical pulse train discharges the capacitor 300.

The capacitor 300 repeats the charge and discharge by a current pulse train output from each of the photodiodes 200*a* and 200*b*. There is generated a clock signal in which a voltage "V" of the capacitor 300 charged and discharged by a current pulse is in the shape of a square wave. A digital clock signal may be input to a clock distribution network (CDN) chip. The voltage "V" corresponding to a capacitance "C" of the capacitor 300 is calculated by integrating a current pulse as expressed by Equation 1 below. A charge and discharge cycle that is determined by current pulses respectively output from the photodiodes 200*a* and 200*b* is one period of a digital clock.

$$\int I dt = CV(t) \quad \text{[Equation 1]}$$

As such, the digital clock signal generating system 10 directly drives the capacitor 300, which generates a clock signal, by using a current pulse obtained from an optical pulse through photoelectric conversion. Accordingly, unlike an existing clock distribution technology for generating and distributing a voltage signal, the digital clock signal generating system 10 may not require a plurality of clock drivers, thus reducing power consumption and solving a heat management issue.

Also, the balanced photodetector 200 may be implemented with various kinds of photoelectric elements. In particular, the balanced photodetector 200 may be implemented with an inexpensive p-i-n photodiode as well as an expensive uni-traveling carrier (UTC)/modified uni-traveling carrier (MUTC) photodiode having high linearity.

Referring to FIG. 2A, an inexpensive p-i-n photodiode may converts an optical pulse into a current pulse in which a rising edge is sharp and a falling edge slowly falls. In this case, a rising edge jitter of the current pulse is smaller than a falling edge jitter thereof. In the case where the capacitor 300 is charged by the current pulse corresponding to FIG. 2A, a clock rising edge in which a jitter (or noise) of a lower portion is low is generated like FIG. 2B. Also, in the case where the capacitor 300 is discharged by the current pulse corresponding to FIG. 2A, a clock falling edge in which a jitter (or noise) of an upper portion is low is generated like FIG. 2B.

Referring to FIG. 3, a timing jitter performance of a rising edge of the inexpensive p-i-n photodiode is similar to a timing jitter performance of a rising edge of the expensive MUTC photodiode. Accordingly, because a jitter is very small at a rising edge of a current pulse regardless of a photodiode type, even though the balanced photodetector 200 is implemented with the inexpensive p-i-n photodiode, it may be possible to generate a low-jitter digital clock signal.

A trigger level of the digital clock signal may be set in consideration of a clock edge jitter. For example, in the case where the balanced photodetector 200 is implemented with the p-i-n photodiode, a lower portion of a clock rising edge, which is generated by integrating a low-jitter rising edge of a current pulse, or an upper portion of a clock falling edge has a low-jitter performance. Accordingly, referring to FIG. 2B, a low-jitter digital clock signal may be generated regardless of a photodiode type by setting a trigger level within a low-jitter period of a digital clock edge.

As such, because a digital clock edge is generated by integrating a current pulse, the digital clock edge may include a portion generated by a rising edge and a portion generated by a falling edge, and a low-jitter period of the digital clock edge is limited to the portion generated by the rising edge. That is, because a rising time of a current pulse is approximately 30 ps and a falling time thereof is 100 ps or greater, a period in which a clock generated by the current pulse has a low-jitter characteristic is approximately 20% of the whole clock edge period.

Below, a method for generating a low-jitter digital clock signal, of which a jitter performance is uniform and excellent in the whole clock edge period, will be described. In this case, a trigger level may not be limited to a partial period corresponding to a rising edge of a current pulse, and a low-jitter clock signal may be generated even though the trigger level is set within the whole clock edge period.

Figure 4:
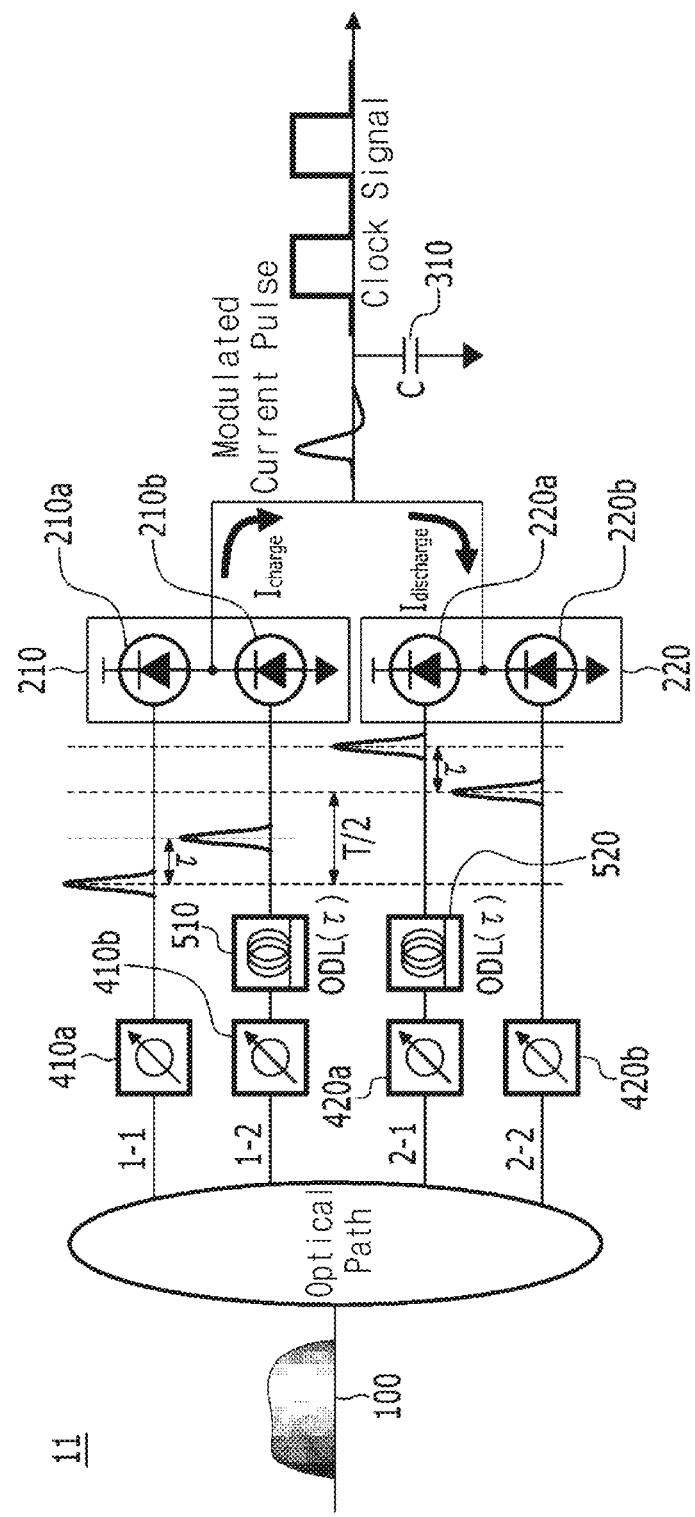
FIG. 4 is a structure diagram of an optical pulse based digital clock signal generating system according to another embodiment.
Figure 5:
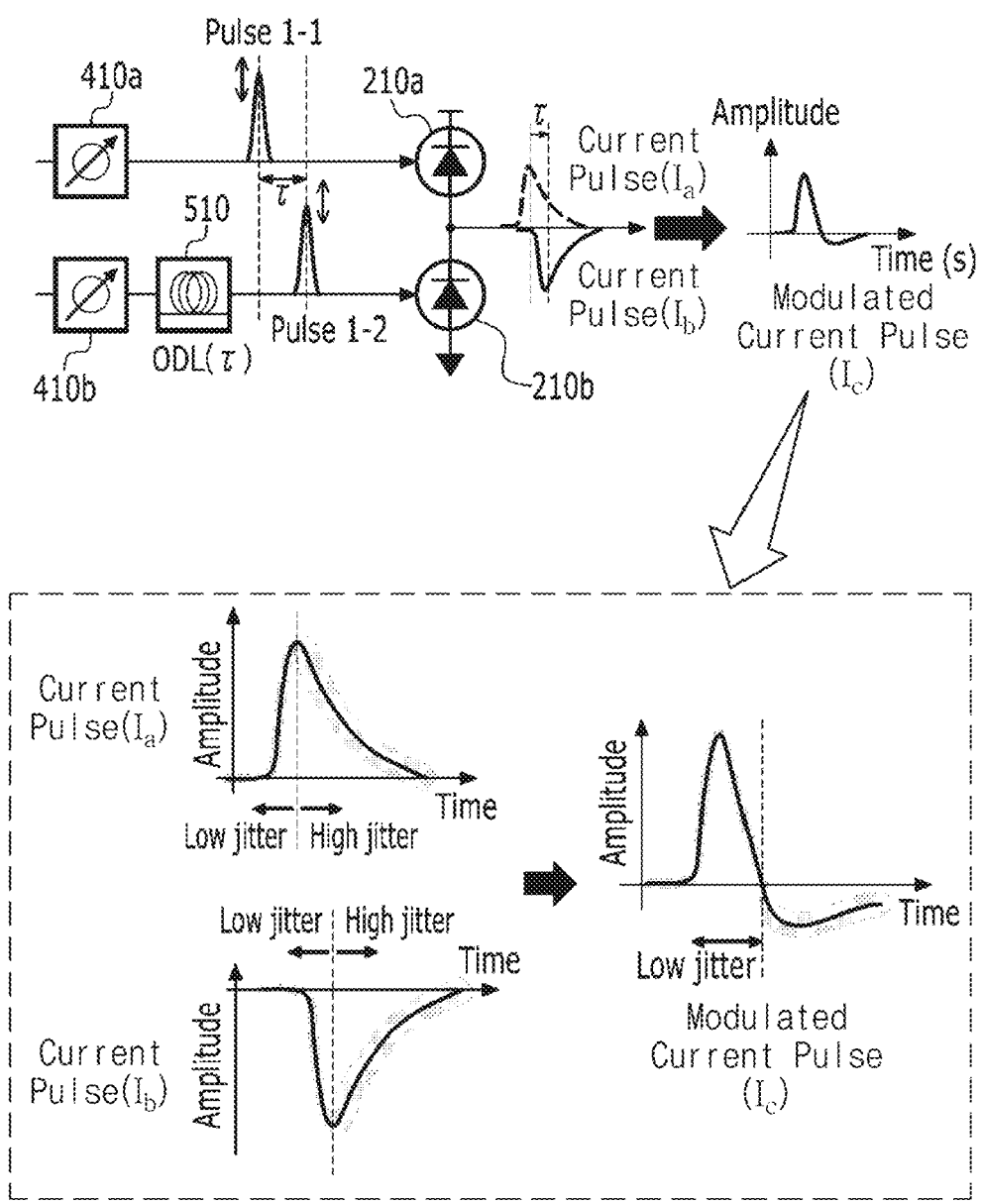
FIG. 5 is a diagram describing how to modulate a current pulse, according to an embodiment.

FIG. 4 is a structure diagram of an optical pulse based digital clock signal generating system according to another embodiment, and FIG. 5 is a diagram describing how to modulate a current pulse, according to an embodiment.

Referring to FIG. 4, a digital clock signal generating system 11 includes the pulse laser 100, two balanced photodetectors 210 and 220, and a capacitor 310 that is charged or discharged by a current pulse output from the balanced photodetectors 210 and 220. The first balanced photodetector 210 is implemented with a circuit in which an optical pulse train is input to each of two serially-connected photodiodes 210*a* and 210*b* and a current pulse generated at the two photodiodes 210*a* and 210*b* through photoelectric conversion is output. Also, the second balanced photodetector 220 is implemented with a circuit in which an optical pulse train is input to each of two serially-connected photodiodes 220*a* and 220*b* and a current pulse generated at the two photodiodes 220*a* and 220*b* through photoelectric conversion is output. An output port of the first balanced photodetector 210 and an output port of the second balanced photodetector 220 are connected to the capacitor 310 so as to charge and discharge the capacitor 310.

The pulse laser 100 outputs an optical pulse periodically. An optical pulse train that is output from the pulse laser 100 is split by at least one coupler (not illustrated) so as to be transferred to a (1-1)-th path and a (1-2)-th path connected to the first balanced photodetector 210 and to a (2-1)-th path and a (2-2)-th path connected to the second balanced photodetector 220. An optical path may be variously designed and may be understood as the first path of FIG. 1 is split into the (1-1)-th path and the (1-2)-th path and the second path of FIG. 1 is split into the (2-1)-th path and the (2-2)-th path.

An electrical pulse that is output from the first balanced photodetector 210 is an electrical pulse that is modulated depending on powers of optical pulses Pulse 1-1 and Pulse 1-2 respectively input to the (1-1)-th path and the (1-2)-th path and a time interval τ between the optical pulses Pulse 1-1 and Pulse 1-2. A shape of the electrical pulse is determined by the powers of the optical pulses Pulse 1-1 and Pulse 1-2 and the time interval τ between the optical pulses Pulse 1-1 and Pulse 1-2.

Likewise, an electrical pulse that is output from the second balanced photodetector 220 is an electrical pulse that is modulated depending on powers of optical pulses Pulse 2-1 and Pulse 2-2 respectively input to the (2-1)-th path and the (2-2)-th path and a time interval τ between the optical pulses Pulse 2-1 and Pulse 2-2. A shape of the electrical pulse is determined by the powers of optical pulses Pulse 2-1 and Pulse 2-2 and the time interval τ between the optical pulses Pulse 2-1 and Pulse 2-2.

The digital clock signal generating system 11 may include modulation devices each adjusting a power and a delay of an optical pulse, and the modulation devices may include, for example, an optical attenuator (OA) and an optical delay line (ODL). There are determined the degree of power attenuation and the degree of delay for the purpose of modulating a current pulse in a required shape. The optical attenuator may be a variable optical attenuator capable of varying the degree of power attenuation, and the optical delay line may be a variable optical delay line capable of varying the degree of delay. The degree of power attenuation of the optical attenuator and the degree of delay of the optical delay line are optimized for a shape of a current pulse to be output or a digital clock/microwave to be generated. In this case, the degree of attenuation and the degree of delay may be fixed to simulated values. Alternatively, the optical attenuator or the optical delay line may actively vary the degree of attenuation or the degree of delay based on a feedback signal for adjusting a shape of a current pulse to be output.

The (1-1)-th, (1-2)-th, (2-1)-th, and (2-2)-th paths may respectively include optical attenuators 410a, 410b, 420a, and 420b, each of which adjusts a power of an optical pulse. In another embodiment, only one of the (1-1)-th path and the (1-2)-th path may include an optical attenuator, and only one of the (2-1)-th path, and the (2-2)-th path may include an optical attenuator. A magnitude of a current pulse that is output from each photodiode may be adjusted by adjusting a power of an optical pulse.

At least a part of the (1-1)-th path, the (1-2)-th path, the (2-1)-th path, and the (2-2)-th path may include optical delay lines (ODL) 510 and 520, each of which adjusts a time interval τ between current pulses that are output from photodiodes. In FIG. 4, it is assumed that the optical delay line 510 is installed on the (1-2)-th path such that an optical pulse of the (1-2)-th path is delayed with respect to the (1-1)-th path as much as a given time τ. In FIG. 4, it is assumed that the optical delay line 520 is installed on the (2-1)-th path such that an optical pulse of the (2-1)-th path is delayed with respect to the (2-2)-th path as much as the given time τ. In detail, as the optical pulse "Pulse 1-2" is delayed by the optical delay line 510 and is input to the photodiode 210b, which is connected to a low voltage (e.g., V−)/a ground, of the first balanced photodetector 210, the first balanced photodetector 210 generates a current pulse such that the capacitor 310 is charged. In contrast, as the optical pulse "Pulse 2-1" is delayed by the optical delay line 520 and is input to the photodiode 220a, which is connected to a high voltage (e.g., V+), of the second balanced photodetector 220, the second balanced photodetector 220 generates a current pulse such that the capacitor 310 is discharged.

Meanwhile, in the balanced photodetector 200 of FIG. 4, optical pulses are input to the first balanced photodetector 210 and the second balanced photodetector 220 with a time difference corresponding to half the period T/2 of a clock. A delay line (not illustrated) installed on the second path may allow optical pulses of the first and second paths to be input to a balanced photodetector with a time difference of T/2, and thus, the optical pulse of the second path may be delayed with respect to the optical pulse of the first path as much as the time difference.

Referring to FIG. 5, a power of the optical pulse "Pulse 1-1" transferred through the (1-1)-th path may be adjusted by the optical attenuator 410a. The power of the optical pulse "Pulse 1-2" transferred through the (1-2)-th path may be adjusted by the optical attenuator 410b, and may be delayed by the optical delay line 510 as much as the given time τ with respect to the optical pulse "Pulse 1-1". In this case, the optical attenuators 410a and 410b may be adjusted such that the power of the optical pulse "Pulse 1-1" is greater than the power of the optical pulse "Pulse 1-2".

The optical pulse "Pulse 1-1" and the optical pulse "Pulse 1-2" are respectively converted into a current pulse $I_a$ and a current pulse $I_b$ by the photodiodes 210a and 210b of the first balanced photodetector 210. Because the current pulse $I_a$ and the current pulse $I_b$ being opposite to each other in a current direction are generated with a time interval corresponding to the given time τ, the current pulse $I_a$ and the current pulse $I_b$ are added at the first balanced photodetector 210, and thus, a current pulse $I_c$ of a new shape is generated.

The current pulse $I_c$ output from the first balanced photodetector 210 is a modulated current pulse that is obtained based on current pulses output from the photodiodes 210a and 210b, and includes a low-jitter rising edge of the current pulse $I_a$ and a low-jitter rising edge of the current pulse $I_b$.

Also, a current pulse output from the second balanced photodetector 220 is a modulated current pulse including low-jitter rising edge characteristics of two current pulses output from the photodiodes 220a and 220b.

FIGS. 6A, 6B, 7A, and 7B are diagrams describing a method for optimizing a digital clock signal through current pulse modulation according to an embodiment.

Referring to FIGS. 6A, 6B, 7A, and 7B, a waveform of a digital clock varies depending on shapes of current pulses output from the first balanced photodetector 210 and the second balanced photodetector 220.

Figure 6A:
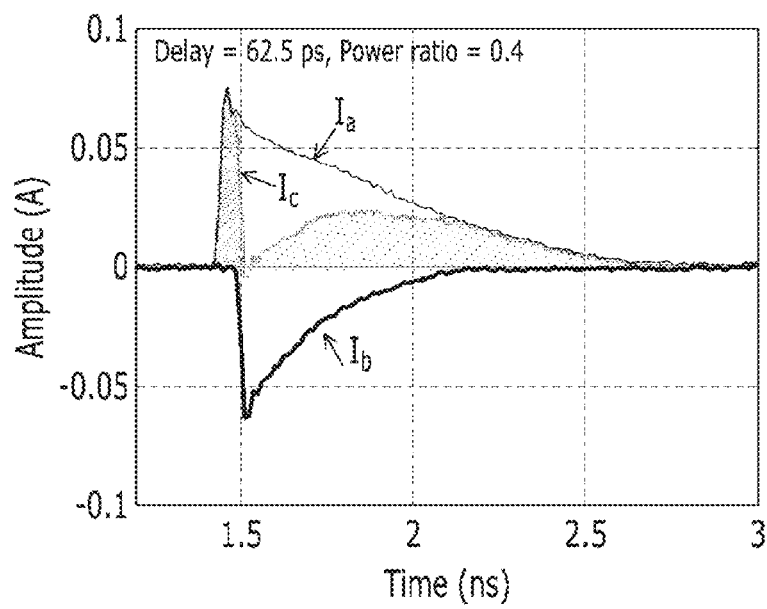
FIGS. 6A, 6B, 7A, and 7B are diagrams describing a method for optimizing a digital clock signal through current pulse modulation according to an embodiment.

In FIG. 6A, the current pulse $I_a$ and the current pulse $I_b$ are output by two optical pulses that are modulated such that a power ratio is 0.4 and a delay is 62.5 ps, and the current pulse $I_c$ is generated by adding the current pulse $I_a$ and the current pulse $I_b$.

Figure 6B:
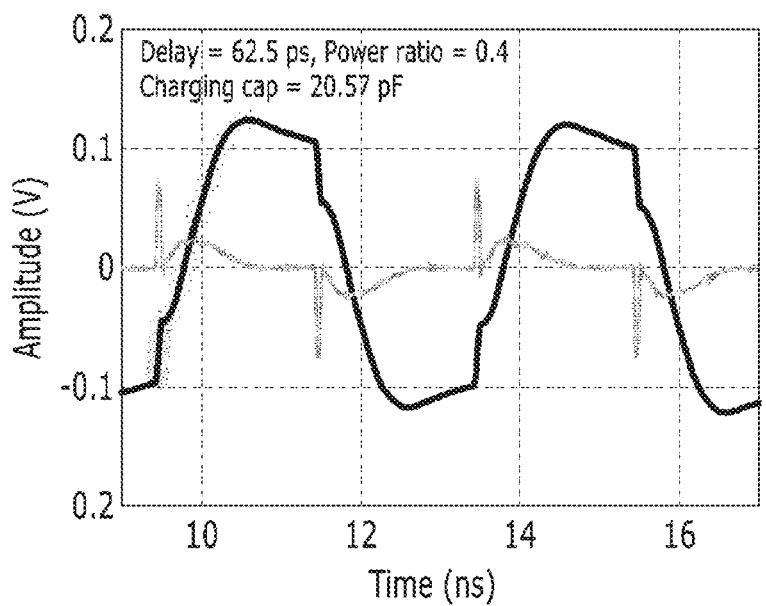

Referring to FIG. 6B, a voltage of the capacitor 310 charged by the current pulse $I_c$ is an integrated value of the current pulse $I_c$ as described with reference to FIG. 1. Here, the capacitor 310 is simulated as having 20.57 pF.

As a result of integrating a pointed region formed by rising edges of the current pulse $I_a$ and the current pulse $I_b$, a pointed region of a modulated current pulse $I_c$ makes a digital clock edge of a sharp slope. In contrast, as a result of integrating a slow region formed by falling edges of the current pulse $I_a$ and the current pulse $I_b$, a slow region of the modulated current pulse $I_c$ makes a digital clock edge of a slow slope. Accordingly, for a digital clock signal to have an excellent timing jitter performance in the whole edge area, the digital clock signal has to be generated dominantly by the pointed region of the modulated current pulse $I_c$. That is, as the pointed region of the modulated current pulse $I_c$ becomes wider than the slow region, the digital clock signal generated by the modulated current pulse $I_c$ may have an excellent timing jitter performance in a wider clock edge region.

Figure 7A:
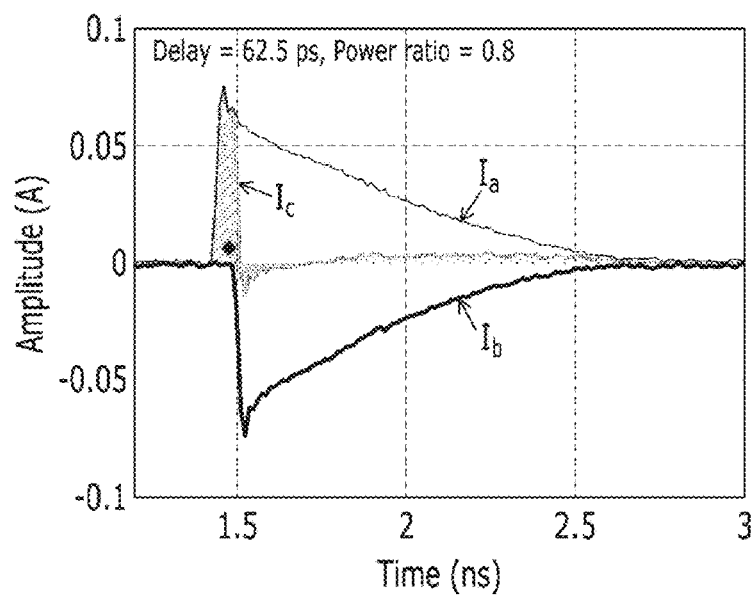

In FIG. 7A, the current pulse $I_a$ and the current pulse $I_b$ are output by two optical pulses that are modulated such that a power ratio is 0.4 and a delay is 62.5 ps, and the current pulse $I_c$ is generated by adding the current pulse $I_a$ and the current pulse $I_b$. A modulated current pulse $I_c$ of FIG. 7A is different in shape from the modulated current pulse $I_c$ of FIG. 6A. A pointed region of a modulated current pulse $I_c$ becomes wider by adjusting a power ratio of two optical pulses through an optical attenuator and adjusting an interval between the two optical pulses through an optical delay line.

Figure 7B:
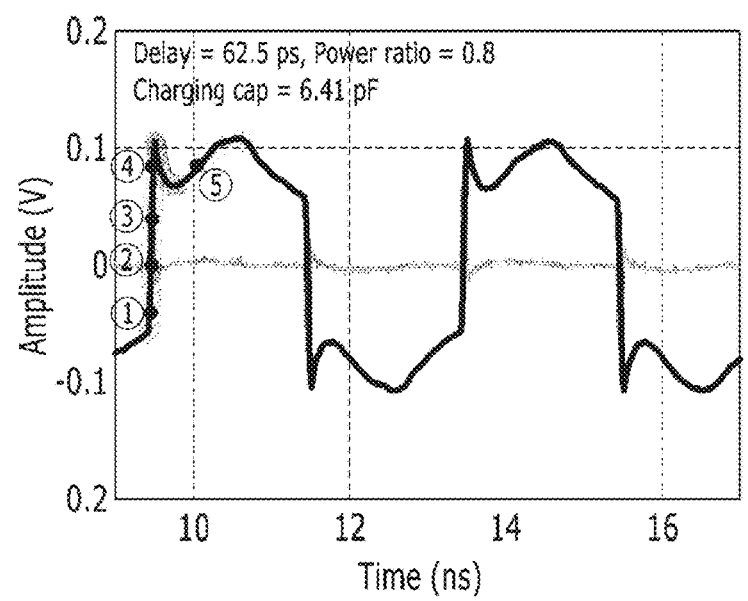

Referring to FIG. 7B, a very sharp digital clock edge is output by a pointed region of a modulated current pulse $I_c$. However, in the case where a signal power ratio is great, a region where a charging current power is negative (i.e., a negative charge) may exist. In this case, a minus region may be minimized by adjusting an optical delay line. Here, the capacitor 310 is simulated as having 6.41 pF, and a power ratio of two optical pulses and a size of a capacitor that a clock is able to drive are trade-off.

As a simulation result obtained by using the modulated current pulse $I_c$ of FIG. 7A, a timing jitter performance of 3 fs or lower may be obtained in most of a digital clock edge region. Accordingly, the digital clock signal generating system 11 may be used in a high-speed analog-to-digital converter (ADC) or signal processing field in which a low-jitter clock signal is required.

TABLE 1

| Location of digital clock edge | Timing jitter |
|---|---|
| Point 1 | 2.3 fs |
| Point 2 | 0.4 fs |
| Point 3 | 0.8 fs |
| Point 4 | 2.3 fs |
| Point 5 | 2 ps |

As such, according to an embodiment, a timing jitter and skew performance may be improved compared to an existing clock distribution network, power consumption may decrease, and a heat management issue may be solved. According to an embodiment, it may be possible to reduce a resource required to maintain and drive a chip while generating a digital clock with an excellent timing performance.

According to an embodiment, through current pulse modulation for adjusting a power and a delay of an optical pulse, a uniform, excellent timing jitter performance may be provided in the whole digital clock edge period. In particular, even though a current pulse generated by a p-i-n photodiode is used, a low-jitter clock signal may be generated.

Figure 8:
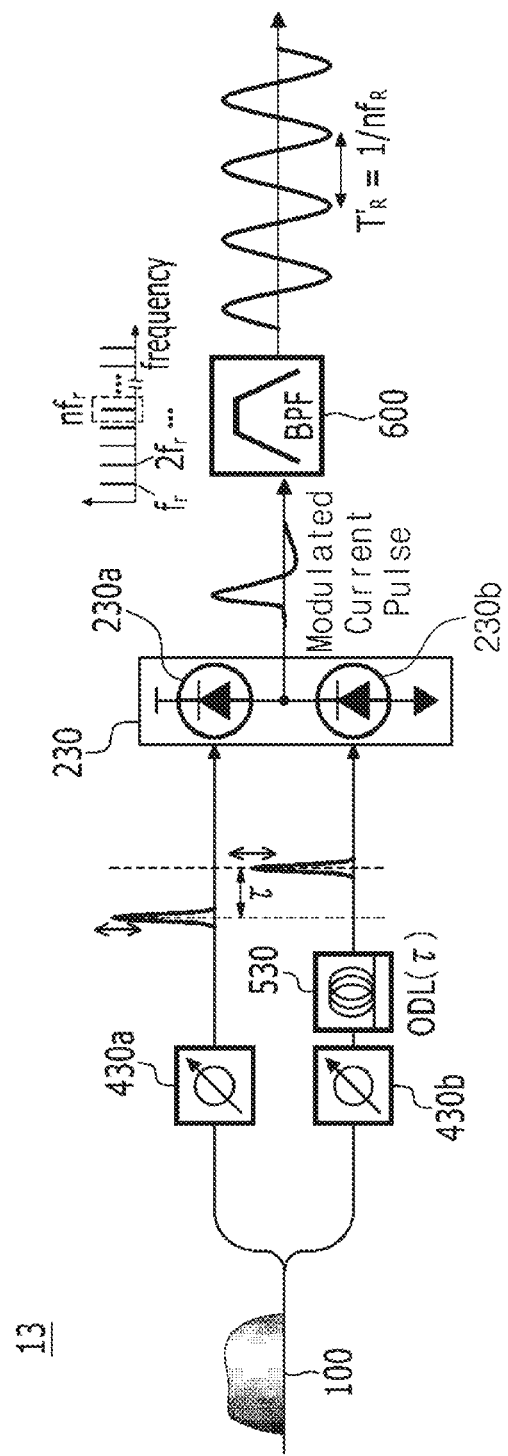
FIG. 8 is a structure diagram of a low-jitter microwave generating system using a balanced photodetector, according to an embodiment.

FIG. 8 is a structure diagram of a low-jitter microwave generating system using a balanced photodetector, according to an embodiment.

Referring to FIG. 8, a low-jitter microwave generating system 13 generates a low-jitter microwave signal by using a current pulse modulated by a balanced photodetector 230.

The low-jitter microwave generating system 13 includes the pulse laser 100, the balanced photodetector 230 performing photoelectric conversion on optical pulses input to two photodiodes 230a and 230b, and a bandpass filter (BPF) 600 filtering a current pulse modulated by current pulses detected by the balanced photodetector 230 with a particular frequency. The particular frequency is a frequency $nf_R$ corresponding to a multiple of a repetition rate $f_R$ of the pulse laser 100. The low-jitter microwave generating system 13 may further include optical attenuators 430a and 430b adjusting powers of optical pulses input to the balanced photodetector 230, and an optical delay line (ODL) 530 adjusting a time interval between the two optical pulses.

An optical pulse output from the pulse laser 100 is split to be transferred to a first path and a second path, a first optical pulse is transferred to the photodiode 230a connected to the first path, and a second optical pulse is transferred to the photodiode 230b connected to the second path.

A power of at least one of the first optical pulse and the second optical pulse is adjusted by the optical attenuator 430a or 430b disposed on the first or second path.

A first optical pulse and a second optical pulse are transferred by the optical delay line (ODL) 530 with a given time interval τ. A second optical pulse input to the photodiode 230b connected to the low voltage V−/the ground may be delayed by the optical delay linen (ODL) 530 as much as the given time τ with respect to the first optical pulse.

As described with reference to FIGS. 5 and 6, each of the two photodiodes 230a and 230b of the balanced photodetector 230 directly performs photodetection on an optical pulse input thereto. Because the current pulse $I_a$ and the current pulse $I_b$ being opposite to each other in a current direction are respectively generated by the two photodiodes 230a and 230b with the given time interval τ, the current pulse $I_a$ and the current pulse $I_b$ are added at the balanced photodetector 230, and thus, the current pulse $I_c$ of a new shape is generated.

The current pulse $I_c$ output from the balanced photodetector 230 is a modulated current pulse that is obtained based on current pulses output from the photodiodes 230a and 230b, and includes a low-jitter rising edge of the current pulse $I_a$ and a low-jitter rising edge of the current pulse $I_b$.

The bandpass filter 600 filters the modulated current pulse with the frequency $nf_R$ corresponding to a multiple of the repetition rate $f_R$ of the pulse laser 100. In the case where the modulated current pulse passes through the bandpass filter 600, one frequency $nf_R$ corresponding to a target mode from among frequencies of the current pulse is used to output a microwave of a sine wave shape. The repetition rate $f_R$ of the pulse laser 100 is a reciprocal of a time interval (period) $T_R$.

Conventionally, an expensive special photodiode such as an MUTC photodiode had to be used to obtain a low-jitter microwave signal. However, the low-jitter microwave generating system 13 may generate a low-jitter microwave signal even at the p-i-n photodiode through modulation of a current pulse having a low-jitter characteristic of a rising edge of the p-i-n photodiode. In particular, it is difficult to implement a structure, such as the MUTC photodiode, in a silicon photonic chip, whereas it is possible to highly integrate a high-speed p-i-n photodiode. For this reason, the low-jitter microwave generating system 13 may be utilized in various fields, in which a low-jitter microwave signal is required, such as a silicon photonic chip. The embodiment of the inventive concept described above may be implemented through a program, which performs a function corresponding to a configuration of the embodiment of the inventive concept, or a recording medium, in which the program is recorded, as well as a device and a method.

According to an embodiment, because a current pulse directly drives a load capacitor of a clock distribution network (CDN), there is no need to use a plurality of clock drivers. Accordingly, according to an embodiment, because the number of clock drivers is markedly reduced, a timing jitter and skew performance may be improved compared to an existing clock distribution network, power consumption may decrease, and a heat management issue may be solved.

According to an embodiment, it may be possible to reduce a resource required to maintain and drive a chip while generating a digital clock with an excellent timing performance.

According to an embodiment, through current pulse modulation for adjusting a power and a delay of an optical pulse, a uniform, excellent timing jitter performance may be provided in the whole digital clock edge period.

According to an embodiment, compared to a clock generating technology using a phase locked loop, in the case of using a pulse laser, it is easy to generate a high frequency signal and control a phase, and a separate feedback circuit or an additional system is not required.

According to an embodiment, even though a current pulse is generated by an inexpensive p-i-n photodiode instead of a modified uni-travelling carrier (MUTC) photodiode, a low-jitter clock signal and a low-jitter microwave may be generated.

Accordingly, a digital clock signal generating system according to an embodiment may have price competitiveness.

While the inventive concept has been described with reference to exemplary embodiments thereof, it will be apparent to those of ordinary skill in the art that various changes and modifications may be made thereto without departing from the spirit and scope of the inventive concept as set forth in the following claims.

What is claimed is:

1. A low-jitter digital clock signal generating system which uses optical pulses output from a pulse laser, comprising:
a first balanced photodetector configured to receive a first optical pulse and a second optical pulse with a delayed time interval, to convert the first optical pulse and the second optical pulse into a first electrical pulse and a second electrical pulse through a first photodiode and a second photodiode, and to output a first modulated pulse generated by allowing the first electrical pulse and the second electrical pulse to partially overlap each other;
a second balanced photodetector configured to receive a third optical pulse and a fourth optical pulse with the delayed time interval, to convert the third optical pulse and the fourth optical pulse into a third electrical pulse and a fourth electrical pulse through a third photodiode and a fourth photodiode, and to output a second modulated pulse generated by allowing the third electrical pulse and the fourth electrical pulse to partially overlap each other; and
a capacitor, wherein the capacitor is charged by the first modulated pulse, is discharged by the second modulated pulse, and outputs a voltage according to the charging and discharging as a clock signal.

2. The low-jitter digital clock signal generating system of claim 1, further comprising:
a first optical delay line configured to delay at least one of the first optical pulse and the second optical pulse as much as a specified time; and
a second optical delay line configured to delay at least one of the third optical pulse and the fourth optical pulse as much as the specified time.

3. The low-jitter digital clock signal generating system of claim 1, further comprising:
a first optical attenuator configured to attenuate at least one of the first optical pulse and the second optical pulse such that the first optical pulse and the second optical pulse have a specified power ratio; and
a second optical attenuator configured to attenuate at least one of the third optical pulse and the fourth optical pulse such that the third optical pulse and the fourth optical pulse have the specified power ratio.

4. The low-jitter digital clock signal generating system of claim 3, wherein the specified power ratio is adjusted based on a waveform of the clock signal generated by the first modulated pulse and the second modulated pulse.

5. The low-jitter digital clock signal generating system of claim 1, wherein each of the first balanced photodetector and the second balanced photodetector is implemented with a p-i-n photodiode.

6. The low-jitter digital clock signal generating system of claim 1, wherein each of the first balanced photodetector and the second balanced photodetector is implemented with a uni-travelling carrier (UTC)/modified uni-travelling carrier (MUTC) photodiode.

7. The low-jitter digital clock signal generating system of claim 1, wherein the first modulated pulse is generated to have a shape including rising edge characteristics of the first electrical pulse and the second electrical pulse by adjusting powers of the first optical pulse and the second optical pulse and a delay difference of the first optical pulse and the second optical pulse, and
wherein the second modulated signal is generated to correspond to the first modulated pulse.

8. The low-jitter digital clock signal generating system of claim 7, wherein the first optical pulse is converted into the first electrical pulse by the first photodiode connected to a high voltage, the second optical pulse delayed with respect to the first optical pulse is converted into the second electrical pulse by the second photodiode connected to a low voltage, and the shape of the first modulated pulse varies depending on a power ratio of the first optical pulse and the second optical pulse and the delay difference of the first optical pulse and the second optical pulse.

9. A low-jitter digital clock signal generating system which uses optical pulses output from a pulse laser, comprising:
a first balanced photodetector configured to convert optical pulses having adjusted powers and delay difference into current pulses through photoelectric conversion and to output a first modulated pulse generated by allowing the current pulses to overlap each other;
a second balanced photodetector having the same structure as the first balanced photodetector, and configured to output a second modulated pulse, which has the same magnitude as the first modulated pulse and is in an opposite direction to the first modulated pulse, with the first modulated pulse and the second modulated signal having a given time interval; and
a capacitor, wherein the capacitor is charged by the first modulated pulse, is discharged by the second modulated pulse, and outputs a voltage according to the charging and discharging as a clock signal.

10. The low-jitter digital clock signal generating system of claim 9, further comprising:
an optical attenuator configured to adjust the powers of the optical pulses output from the pulse laser; and
an optical delay line configured to adjust the delay difference such that the current pulses generated based on the optical pulses output from the pulse laser overlap each other,
wherein the optical pulses, of which the powers and the delay difference are adjusted through the optical attenuator and the optical delay line, are input to the first balanced photodetector and the second balanced photodetector.

11. The low-jitter digital clock signal generating system of claim 10, wherein the optical attenuator and the optical delay line vary the powers and the delay difference of the optical pulses respectively input to the first balanced photodetector and the second balanced photodetector to vary a waveform of the clock signal.

12. The low-jitter digital clock signal generating system of claim 9, wherein, by adjusting the powers and the delay difference of the optical pulses generating electrical pulses, each of the first modulated pulse and the second modulated pulse is generated to have a shape including rising edge characteristics of the electrical pulses overlapping each other.

13. The low-jitter digital clock signal generating system of claim 9, wherein each of the first balanced photodetector and the second balanced photodetector is implemented with a p-i-n photodiode.

14. The low-jitter digital clock signal generating system of claim 9, wherein each of the first balanced photodetector and the second balanced photodetector is implemented with a uni-travelling carrier (UTC)/modified uni-travelling carrier (MUTC) photodiode.

* * * * *